(12) United States Patent
Sugama et al.

(10) Patent No.: US 8,207,654 B2
(45) Date of Patent: Jun. 26, 2012

(54) PIEZOELECTRIC VIBRATOR

(75) Inventors: Kazuyoshi Sugama, Chiba (JP); Masashi Numata, Chiba (JP); Shuji Yamane, Chiba (JP)

(73) Assignee: Seiko Instruments Inc., Chiba (JP)

( * ) Notice: Subject to any disclaimer, the term of this patent is extended or adjusted under 35 U.S.C. 154(b) by 109 days.

(21) Appl. No.: 12/690,382

(22) Filed: Jan. 20, 2010

(65) Prior Publication Data

US 2010/0181872 A1 Jul. 22, 2010

(30) Foreign Application Priority Data

Jan. 20, 2009 (JP) .................... 2009-010184

(51) Int. Cl.
*H01L 41/053* (2006.01)
(52) U.S. Cl. ........................................ 310/348
(58) Field of Classification Search ............. 310/320, 310/340, 344, 348
See application file for complete search history.

(56) References Cited

U.S. PATENT DOCUMENTS

| | | | | | |
|---|---|---|---|---|---|
| 4,152,616 | A | * | 5/1979 | Ozbirn et al. | 310/344 |
| 6,005,329 | A | * | 12/1999 | Ikeda et al. | 310/340 |
| 2004/0021402 | A1 | * | 2/2004 | Morley et al. | 310/348 |
| 2009/0117336 | A1 | * | 5/2009 | Usui et al. | 428/172 |
| 2009/0167116 | A1 | * | 7/2009 | Miyashita et al. | 310/348 |
| 2010/0308696 | A1 | * | 12/2010 | Numata et al. | 310/344 |
| 2010/0320872 | A1 | * | 12/2010 | Numata et al. | 310/344 |

FOREIGN PATENT DOCUMENTS

| JP | 2001-267190 A | 9/2001 |
|---|---|---|
| JP | 2007-328941 A | 12/2007 |

* cited by examiner

*Primary Examiner* — Derek Rosenau
(74) *Attorney, Agent, or Firm* — Brinks Hofer Gilson & Lione

(57) ABSTRACT

A piezoelectric oscillator is provided, which has a through electrode providing reliable conduction between a piezoelectric vibrating piece and an external electrode with rare occurrence of a large stress caused by temperature variation in processing or deformation of a mounted base substrate, while the hermeticity of a cavity is maintained. A piezoelectric oscillator having a piezoelectric vibrating piece sealed in a cavity defined between a base substrate and a lid substrate includes a through electrode disposed in a through hole penetrating through the base substrate, and the through electrode has a glass frit filled in the through hole and fired and a core formed of a material containing only iron and nickel and disposed in the through hole together with the glass frit. The values of the thermal expansion coefficients of the base substrate, the glass frit, and the core are set as: base substrate glass≧frit>core.

9 Claims, 6 Drawing Sheets

FIG. 13

| CORE MATERIAL | THERMAL COEFFICIENT (ppm) | | | STRESS (MPa) | | | | |
|---|---|---|---|---|---|---|---|---|
| | | | | COOLING SIMULATION AFTER FIRED | | BEND SIMULATION FOR SUBSTRATE | | |
| | CORE | GLASS FRIT | BASE SUBSTRATE | BASE SIDE | FRIT SIDE | BASE SIDE | FRIT SIDE | LID SIDE |
| KOVAR | 4.81 | 8.60 | 8.33 | 56.1 | 125.9 | 76.1 | 104.9 | 25.1 |
| KOVAR | 4.81 | 6.57 | 8.33 | 88.8 | 64.5 | 103.7 | 85.7 | 22.7 |
| KOVAR | 4.81 | 4.81 | 8.33 | 117.0 | 39.7 | 129.2 | 91.5 | 18.9 |
| 42 ALLOY | 6.70 | 8.00 | 8.33 | 34.7 | 38.3 | 74.4 | 70.2 | 25.8 |
| 42 ALLOY | 6.70 | 7.80 | 8.33 | 38.2 | 35.9 | 77.2 | 69.5 | 25.8 |
| 50 ALLOY | 9.70 | 9.70 | 8.33 | 36.3 | 40.2 | 86.8 | 113.5 | 25.2 |
| 50 ALLOY | 9.70 | 9.02 | 8.33 | 20.8 | 29.0 | 78.7 | 97.5 | 25.6 |
| 50 ALLOY | 9.70 | 8.80 | 8.33 | 17.8 | 48.7 | 88.1 | 93.1 | 25.5 |
| 50 ALLOY | 9.70 | 8.60 | 8.33 | 12.7 | 47.9 | 85.7 | 88.4 | 25.6 |

PIEZOELECTRIC VIBRATOR

RELATED APPLICATIONS

This application claims priority under 35 U.S.C. §119 to Japanese Patent Application No. 2009-010184 filed on Jan. 20, 2009, the entire content of which is hereby incorporated by reference.

BACKGROUND OF THE INVENTION

1. Field of the Invention

The present invention relates to a piezoelectric vibrator, and more specifically to a surface mount piezoelectric vibrator in which a piezoelectric vibrating piece is sealed in a cavity defined between two bonded substrates.

2. Description of the Related Art

In recent years, mobile telephones and portable information terminal devices employ a piezoelectric vibrator using quartz crystal as a time source, a timing source of control signals, and a reference signal source. As this type of piezoelectric vibrator, various ones are known. As one of them, there is a piezoelectric vibrator of a surface mount device (SMD).

As a typical surface mount piezoelectric vibrator, a three layer structure type is generally known in which a piezoelectric substrate formed with a piezoelectric vibrating piece is sandwiched between a base substrate and a lid substrate from above and below. In this case, the piezoelectric vibrator is accommodated in a cavity (airtight chamber) defined between the base substrate and the lid substrate. In addition, in recent years, two layer structure types are also developed, different from the three layer structure type.

The two layer structure type piezoelectric vibrator is formed to have a two layer structure by directly bonding a base substrate to a lid substrate, in which a piezoelectric vibrating piece is accommodated in a cavity defined between these two substrates. The two layer structure type piezoelectric vibrator is excellent for preferable use in that its thickness can be reduced as compared with three layer structure ones. As one of those two layer structure type piezoelectric vibrators, such a piezoelectric vibrator is known that a conductive member that is formed so as to penetrate through a base substrate is used to bring a piezoelectric vibrating piece and an external electrode formed on a base substrate into conduction (for example, see JP-A-2001-267190 (Patent Document 1) and JP-A-2007-328941 (Patent Document 2)).

In the piezoelectric vibrators described in Patent Document 1 and Patent Document 2, a through hole is formed in an insulating base substrate formed of ceramics or glass. Then, the conductive member is buried in the through hole such that the through hole is blocked. The conductive member is electrically connected to the external electrode formed on the undersurface of the base substrate as well as electrically connected to the piezoelectric vibrating piece accommodated in a cavity.

In the piezoelectric vibrator, the conductive member serves for two main roles: a) blocking the through hole to maintain hermeticity in the cavity, and b) bringing the piezoelectric vibrating piece and the external electrode into conduction. When the through hole is insufficiently contacted with the conductive member, hermeticity in the cavity is sometimes impaired. In addition, when electrical connection of the conductive member to the piezoelectric vibrating piece or to the external electrode is insufficient, this poor electrical connection causes malfunction of the piezoelectric vibrating piece. Therefore, in order to eliminate such failure, it is important to form the conductive member in such a way that the conductive member fully blocks the through hole as firmly contacted with the inner surface of the through hole as well as no dent is made on the surface.

When a conductive paste is used as a conductive member, it is necessary that the conductive paste is buried in the through hole, fired, and cured. However, when the conductive paste is fired, organic substances contained in the conductive paste are evaporated and lost, and thus the volume after fired is generally reduced as compared with the volume before fired (for example, when Ag paste is used as a conductive paste, about 20% of the volume is reduced). On this account, even though a conductive paste is used to form a conductive member, a dent occurs in the surface, or in the worst case, a through hole is formed at the center. Consequently, a problem arises that hermeticity in the cavity is impaired, or continuity between the piezoelectric vibrating piece and the external electrode is impaired.

In order to solve this problem, such a method is proposed in which a metal pin is disposed in a through hole, and a paste material such as a glass frit is filled in a clearance between the through hole and the pin and fired to form a through electrode. The through electrode is formed in this manner, whereby the volume is reduced only in the portion of the paste material. Therefore, the time required for the polishing process after that can be shortened, and the through electrode can be efficiently formed.

SUMMARY OF THE INVENTION

In firing the paste material, a base substrate is heated at high temperature with the pin and the paste material disposed. On this account, the volumes of the base substrate, the pin, and the paste material expand according to their thermal expansion coefficients.

Here, preferably, the thermal expansion coefficient of the paste material is generally set greater than the thermal expansion coefficient of the pin. This is advantageous to maintaining the hermeticity of the through hole because the expansion of the paste material exceeds the expansion of the pin to apply compressive force to the pin in firing, when the thermal expansion coefficients are set in this manner.

However, in the case in which the thermal expansion coefficient of the pin is too small, the range of deforming the paste material after fired becomes too large when cooled after the paste material is fired, or when the base substrate is deformed after mounted. As the result, a large stress is sometimes applied to the paste material and the base substrate after fired. Consequently, a problem arises that the piezoelectric vibrator may be damaged.

The invention has been made in the light of the circumstances, and it is an object of the invention to provide a piezoelectric vibrator having a through electrode capable of reliably bringing a piezoelectric vibrating piece and an external electrode into conduction in which a large stress hardly occurs when a component is cooled after the component is fired or when a base substrate is deformed after the base substrate is mounted, and the hermeticity of a cavity is maintained.

The invention is a piezoelectric vibrator having a piezoelectric vibrating piece sealed in a cavity defined between a base substrate and a lid substrate bonded to each other, the piezoelectric vibrator including: a through electrode disposed in a through hole penetrating through the base substrate in its thickness direction, wherein the through electrode has a glass frit filled in the through hole and fired, and a core formed of a material containing only iron and nickel as metals and disposed in the through hole together with the glass frit for bringing the outside of the cavity and the piezoelectric vibrating piece into conduction, and wherein values of thermal expansion coefficients of the base substrate, the glass frit, and the core are set as: the base substrate≧the glass frit>the core.

In accordance with the piezoelectric vibrator according to the invention, because the difference between the thermal expansion coefficients of the glass frit and the base substrate is small, a large stress hardly occurs in the interface between them. In addition, because the thermal expansion coefficient of the core is smaller than the thermal expansion coefficient of the glass frit, the hermeticity of the cavity can be preferably maintained.

The core may be formed of an alloy containing 58 percent by weight of iron and 42 percent by weight of nickel. In this case, the core can be formed of 42 alloy that is an alloy widely used, and the piezoelectric vibrator according to the invention can be readily fabricated at low costs.

In accordance with the piezoelectric vibrator according to the invention, a piezoelectric vibrator can be provided, which has a through electrode capable of reliably bringing a piezoelectric vibrating piece and an external electrode into conduction in which a large stress hardly occurs when a component is cooled after the component is fired or when a base substrate is deformed after the base substrate is mounted, and the hermeticity of a cavity is maintained.

BRIEF DESCRIPTION OF THE DRAWINGS

The teachings of the invention can be readily understood by considering the following detailed description in conjunction with the accompanying drawings, in which:

FIG. 13 is a table showing simulation results of the relation between the stresses occurring and the configurations of a base substrate, a glass frit, and a core in the same piezoelectric vibrator.

DETAILED DESCRIPTION OF THE PREFERRED EMBODIMENTS

Hereinafter, an embodiment of the invention will be described with reference to FIGS. 1 to 13.

As shown in FIGS. 1 to 13, a piezoelectric vibrator 1 according to the embodiment is a surface mount piezoelectric vibrator formed in a box shape of a two layer stack having a base substrate 2 and a lid substrate 3, in which a piezoelectric vibrating piece 4 is accommodated in a cavity C defined by the base substrate 2 and the lid substrate 3.

The piezoelectric vibrating piece 4 is a publicly known tuning fork vibrating piece formed of a piezoelectric material such as quartz crystal, lithium tantalate, or lithium niobate, and vibrates when a predetermined voltage is applied.

Figure 2:
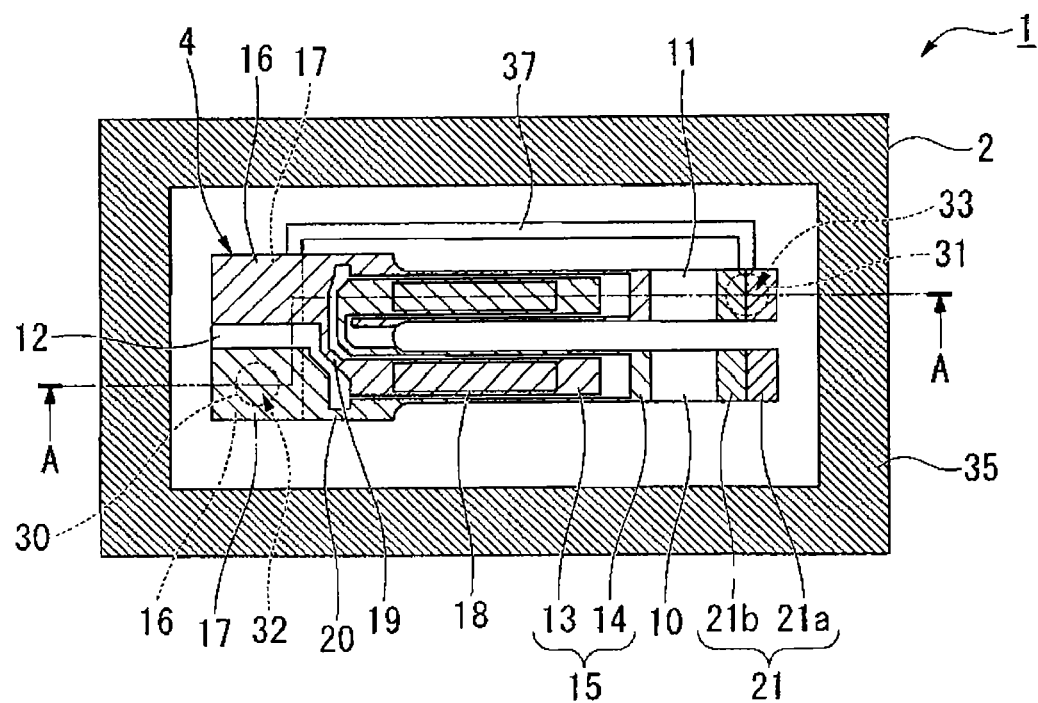
FIG. 2 is a plan view depicting the same piezoelectric vibrator with a lid substrate removed.

As shown in FIG. 2, the piezoelectric vibrating piece 4 has a pair of oscillating arms 10 and 11 disposed in parallel with each other, a base portion 12 that fixes the base end sides of the oscillating arms 10 and 11 in one piece, an excitation electrode 15 that is formed of a first excitation electrode 13 and a second excitation electrode 14 and formed on the outer surfaces of the oscillating arms 10 and 11 to cause a pair of the oscillating arms 10 and 11 to vibrate, and mount electrodes 16 and 17 electrically connected to the first excitation electrode 13 and the second excitation electrode 14, respectively.

In addition, the piezoelectric vibrating piece 4 according to the embodiment has a groove 18 formed on both of the main surfaces of a pair of the oscillating arms 10 and 11 along the longitudinal direction of the oscillating arms 10 and 11. The groove 18 is formed from the base end sides of the oscillating arms 10 and 11 to near the center part thereof.

The excitation electrode 15 formed of the first excitation electrode 13 and the second excitation electrode 14 is an electrode that causes a pair of the oscillating arms 10 and 11 to vibrate at a predetermined resonance frequency in the direction of bringing a pair of the oscillating arms 10 and 11 close to each other or separating them from each other, and the excitation electrode 15 is patterned and formed on the outer surfaces of the oscillating arms 10 and 11 as electrically isolated from each other. More specifically, the first excitation electrode 13 is mainly formed on the groove 18 of the oscillating arm 10 and on two side surfaces of the oscillating arm 11, and the second excitation electrode 14 is mainly formed on two side surfaces of the oscillating arm 10 and on the groove 18 of the oscillating arm 11.

In addition, the first excitation electrode 13 and the second excitation electrode 14 are electrically connected to the mount electrodes 16 and 17 through lead electrodes 19 and 20, respectively, on both of the main surfaces of the base portion 12. Then, a voltage is applied to the piezoelectric vibrating piece 4 through the mount electrodes 16 and 17.

In addition, the excitation electrode 15, the mount electrodes 16 and 17, and the lead electrodes 19 and 20 are formed of coatings of conductive films such as chromium (Cr), nickel (Ni), aluminum (Al), or titanium (Ti), for example.

In addition, at the tip ends of a pair of the oscillating arms 10 and 11, a weight metal film 21 is coated for control of the vibration state (frequency control) such that a pair of the oscillating arms 10 and 11 vibrates within a range of a predetermined frequency. In addition, the weight metal film 21 is separated into a coarse tuning film 21a for use in coarsely tuning frequencies, and a fine tuning film 21b for use in finely tuning frequencies. The coarse tuning film 21a and the fine tuning film 21b are used to perform frequency control, whereby the frequency of a pair of the oscillating arms 10 and 11 is allowed to fall in the range of a nominal frequency of a device.

Figure 3:
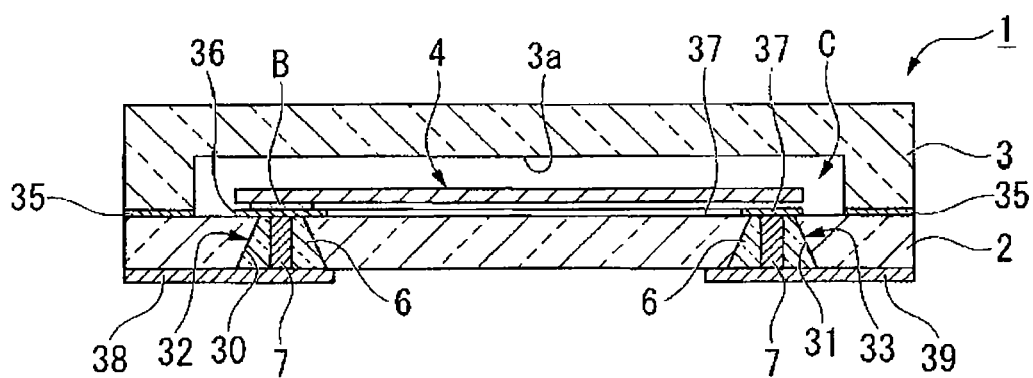
FIG. 3 is a cross section at line A-A shown in FIG. 2.

As shown in FIG. 3, the piezoelectric vibrating piece 4 thus configured is bonded to the top surface of the base substrate 2 (the surface on the cavity C side) through a bump with the use of a bump B made of, for example, gold. More specifically, on two bumps B formed on routing electrodes 36 and 37, described later, which are patterned on the top surface of the base substrate 2, a pair of the mount electrodes 16 and 17 is bonded through the bumps as the mount electrodes 16 and 17 are contacted with each other. Thus, the piezoelectric vibrating piece 4 is supported as separated from and floated above the top surface of the base substrate 2, and the mount electrodes 16 and 17 are electrically connected to the routing electrodes 36 and 37, respectively.

Figure 1:
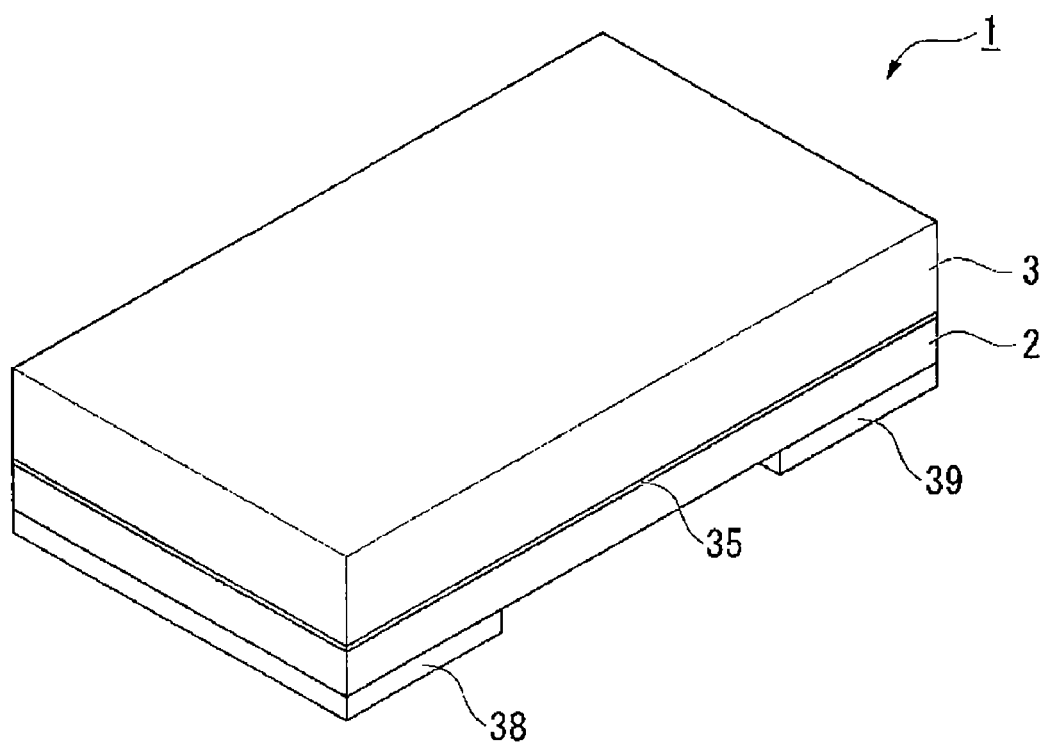
FIG. 1 is a perspective view depicting the appearance of an embodiment of a piezoelectric vibrator according to the invention.

The lid substrate 3 is a transparent insulating substrate formed of a glass material such as soda-lime glass, and is formed in a plate shape as shown in FIGS. 1 and 3. Then, on the bonding surface side to which the base substrate 2 is bonded, a rectangular recessed part 3a is formed in which the piezoelectric vibrating piece 4 is accommodated. The recessed part 3a is a cavity recessed part to be the cavity C for accommodating the piezoelectric vibrating piece 4 in the cavity when the two substrates 2 and 3 are laid on each other. Then, the lid substrate 3 is anodically bonded to the base substrate 2 as the recessed part 3a is faced to the top surface of the base substrate 2.

The base substrate 2 is a transparent insulating substrate formed of a glass material similar to the lid substrate 3, and is formed in a plate shape in the size to be laid on the lid substrate 3 as shown in FIGS. 1 to 3.

In the base substrate 2, a pair of through holes 30 and 31 is formed to penetrate through the base substrate 2 in the thickness direction. A pair of the through holes 30 and 31 is disposed such that they are opened in the cavity C. More specifically, the through hole 30 is formed at the corresponding position on the base portion 12 side of the mounted piezoelectric vibrating piece 4, and the through hole 31 is formed at the corresponding position on the tip end sides of the oscillating arms 10 and 11.

In addition, in the embodiment, the through hole in a tapered cross section having the diameter being gradually reduced from the undersurface to the top surface of the base substrate 2 is taken and described as an example. However, the shape of the through hole is not limited to this shape. For example, an approximately cylindrical through hole may be possible whose diameter is equal in the axial direction. In any cases, the shape of the through hole has no particular restrictions as long as the through hole penetrates through the base substrate 2.

Then, in a pair of the through holes 30 and 31, a pair of through electrodes 32 and 33 is formed to bury the through holes 30 and 31, respectively. As shown in FIG. 3, the through electrodes 32 and 33 are each formed of a conical piece 6 and a core 7 fixed in one piece to each of the through holes 30 and 31 by firing, and serve to fully block the through holes 30 and 31 for maintaining hermeticity in the cavity C as well as to bring the routing electrodes 36 and 37 and external electrodes 38 and 39, described later, into conduction.

The conical piece 6 is formed by firing a paste glass frit. Both ends of the conical piece 6 are almost flat, and the conical piece 6 is formed to have almost the same thickness as that of the base substrate 2, in which the core 7 is disposed at the center of the conical piece 6 to penetrate through the conical piece 6. In the embodiment, the outside shape of the conical piece 6 is formed into an approximately truncated cone (in a tapered cross section) as matched with the shapes of the through holes 30 and 31. Then, as shown in FIG. 3, the conical piece 6 is fired as buried in the through holes 30 and 31, and is firmly fixed to each of the through holes 30 and 31.

The core 7 is a cylindrical conductive core material formed of 42 alloy, described later, and the core 7 is formed to have flat ends as similar to the conical piece 6 and to have almost the same thickness as the thickness of the base substrate 2. In addition, as shown in FIG. 3, when the through electrodes 32 and 33 are completed, as discussed above, the core 7 is formed to have the same thickness as the thickness of the base substrate 2 (including almost the same thickness). However, in the process of fabrication, the length of the core 7 is shorter than the initial thickness of the base substrate 2 in the process of fabrication by a predetermined length, 0.02 mm, for example (this will be described in detail in the description of a fabricating method). Then, the core 7 is positioned in the center of the hole of the conical piece 6, and is firmly fixed to the conical piece 6 by firing the conical piece 6.

In addition, the through electrodes 32 and 33 are reliably provided with electrical continuity through the conductive core 7.

As shown in FIGS. 1 and 3, on the top surface side of the base substrate 2 (the surface to which the lid substrate 3 is bonded), a bonding film 35 for anodic bonding and a pair of the routing electrodes 36 and 37 are patterned with a conductive material (for example, aluminum). Among them, the bonding film 35 is formed along the outer edge of the top surface of the base substrate 2 such that the bonding film 35 surrounds the edge of the recessed part 3a formed on the lid substrate 3.

In addition, each of the routing electrodes 36 and 37 is patterned such that in a pair of the through electrodes 32 and 33, the through electrode 32 is electrically connected to the mount electrode 16 of the piezoelectric vibrating piece 4, and the through electrode 33 is electrically connected to the mount electrode 17 of the piezoelectric vibrating piece 4.

More specifically, the routing electrode 36 is formed right above the through electrode 32 such that the routing electrode 36 is positioned just below the base portion 12 of the piezoelectric vibrating piece 4. In addition, the routing electrode 37 is formed such that the routing electrode 37 is routed from the position adjacent to the routing electrode 36 to the tip end sides of the oscillating arms 10 and 11 along the oscillating arms 10 and 11 and then positioned right above the through electrode 33.

Then, the bump B is formed on each of a pair of the routing electrodes 36 and 37, and the bumps B are used to mount the piezoelectric vibrating piece 4. Thus, the mount electrode 16 of the piezoelectric vibrating piece 4 is conducted to the through electrode 32 through the routing electrode 36, and the mount electrode 17 is conducted to the through electrode 33 through the routing electrode 37.

As shown in FIGS. 1 and 3, on the undersurface of the base substrate 2, the external electrodes 38 and 39 are formed, which are electrically connected to a pair of the through electrodes 32 and 33, respectively. In other words, the external electrode 38 is electrically connected to the first excitation electrode 13 of the piezoelectric vibrating piece 4 through the through electrode 32 and through the routing electrode 36. In addition, the external electrode 39 is electrically connected to the second excitation electrode 14 of the piezoelectric vibrating piece 4 through the through electrode 33 and through the routing electrode 37. Thus, the external electrodes 38 and 39 are contacted with an external substrate, for example, to operably mount the piezoelectric vibrator on that substrate.

When the piezoelectric vibrator 1 thus configured is operated, a predetermined drive voltage is applied to the external electrodes 38 and 39 formed on the base substrate 2. Therefore, current can be carried through the excitation electrode 15 formed of the first excitation electrode 13 and the second excitation electrode 14 of the piezoelectric vibrating piece 4, and a pair of the oscillating arms 10 and 11 can vibrate at a predetermined frequency in the direction of bringing a pair of the oscillating arms 10 and 11 close to each other or separating them from each other. Then, with the use of the vibrations of a pair of the oscillating arms 10 and 11, the piezoelectric vibrator 1 can be used as a time source, a timing source of control signals, or a reference signal source.

Next, the fabrication process steps of the through electrodes 32 and 33 will be described.

Figure 4:
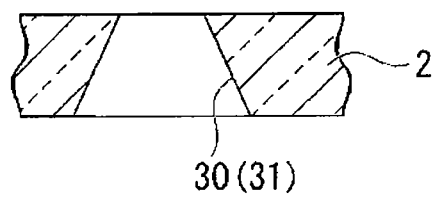
FIG. 4 is a diagram depicting one process of forming a through electrode of the same piezoelectric vibrator.

First, a pair of the through holes 30 and 31 is formed on the base substrate 2 such that the through holes 30 and 31 penetrate through the base substrate 2 in the thickness direction. This step may be performed by sandblasting, for example, from the undersurface side of the base substrate 2. When this step is performed in this manner, as shown in FIG. 4, the through hole 30 and 31 can be formed in a tapered cross section having the diameter being gradually reduced from the undersurface to the top surface of the base substrate 2. The through hole 30 and 31 are formed and opened in the recessed part 3a formed in the lid substrate 3 such that the through hole 30 is positioned at the base portion 12 side of the piezoelectric vibrating piece 4 and the through hole 31 is positioned on the tip end sides of the oscillating arms 10 and 11 when the base substrate 2 is laid on the lid substrate 3 later.

Figure 5:
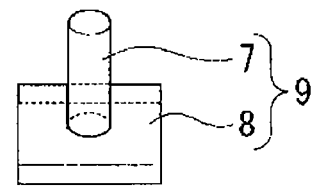
FIG. 5 is a diagram depicting a pin product used for forming the same through electrode.

Subsequently, a pin product 9 having the portion to be the core 7 is inserted and disposed in each of the through holes 30 and 31, and a paste glass frit 6a formed of a glass material is filled in each of the through holes 30 and 31. For the pin product 9 used at this time, as shown in FIG. 5, preferably, the pin product 9 has a base part 8 in a flat plate shape, and the core 7 formed on the base part 8 to have the length shorter than the thickness of the base substrate 2 by a predetermined value, 0.02 mm, for example, along the direction nearly orthogonal to the flat plate surface of the base part 8 and having a flat tip end.

Figure 6:
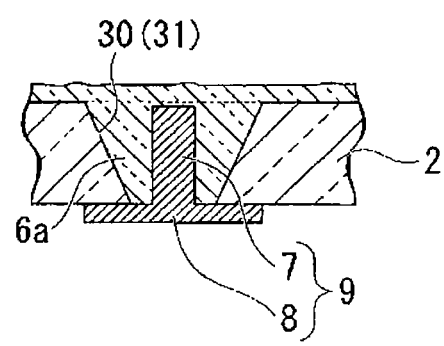
FIG. 6 is a diagram depicting one process of forming the through electrode of the same piezoelectric vibrator.

Subsequently, as shown in FIG. 6, the core 7 is inserted until the base part 8 of the pin product 9 is contacted with the base substrate 2. At this time, it is necessary to dispose the pin product 9 such that the axial direction of the core 7 is almost matched with the axial directions of the through holes 30 and 31. However, because the pin product 9 having the core 7 formed on the base part 8 is used, the axial direction of the core 7 can be almost matched with the axial directions of the through holes 30 and 31 by a simple work to only push the pin product 9 until the base part 8 is contacted with a base substrate wafer 40. Therefore, workability in the setting step can be improved.

In addition to this, the base part 8 is contacted with the surface of the base substrate 2, whereby the paste glass frit 6a can be reliably filled in the through holes 30 and 31.

Moreover, because the base part 8 is formed in a flat plate shape, the base substrate 2 is stable with no wobbles, even though the base substrate 2 is placed on the flat surface of a desk, for example, after the pin product 9 is disposed in the through hole until the glass frit 6a is fired, described later. Also from this point, workability can be improved.

Figure 7:
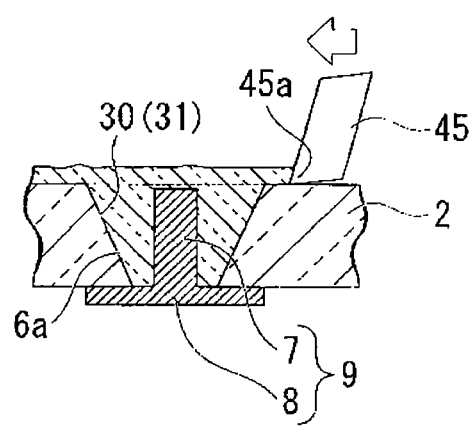
FIG. 7 is a diagram depicting one process of forming the through electrode of the same piezoelectric vibrator.
Figure 8:
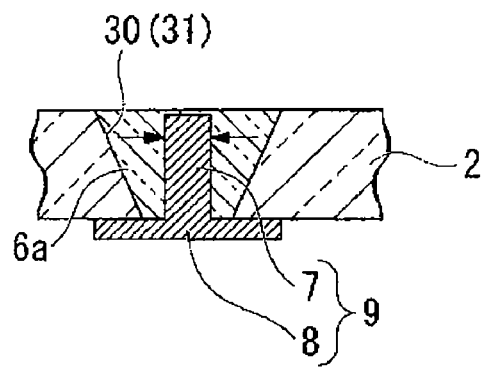
FIG. 8 is a diagram depicting one process of forming the through electrode of the same piezoelectric vibrator.

In filling the glass frit 6a in each of the through holes 30 and 31, a little extra amount of the glass frit 6a is coated such that the glass frit 6a is reliably filled in each of the through holes 30 and 31. Therefore, the glass frit 6a is as well coated on the surface of the base substrate 2. An extra amount of the glass frit 6a is removed before fired, because the time required for polishing work, described later, is prolonged when the glass frit 6a is fired in this state. In this work, as shown in FIG. 7, preferably, a resin squeegee 45, for example, is used to contact a tip end 45a of the squeegee 45 with the surface of the base substrate 2 and moved over the surface, thereby removing the glass frit 6a. When this is performed as described above, as shown in FIG. 8, an extra glass frit 6a can be reliably removed by a simple work. In the embodiment, because the length of the core 7 of the pin product 9 is formed shorter than the thickness of the base substrate 2 by 0.02 mm, the tip end 45a of the squeegee 45 is not contacted with the tip end of the core 7, and the core 7 is prevented from tilting toward the axis of the through hole when the squeegee 45 passes over the through holes 30 and 31.

In addition, in the case in which the through hole is formed in the shape in the embodiment, as shown in FIG. 6, preferably, the glass frit 6a is easily filled in the through hole when the pin product 9 is inserted from the top surface side of the base substrate 2 having a smaller diameter of the through hole.

Subsequently, the buried filler is fired at a predetermined temperature. Thus, the through holes 30 and 31, the glass frit 6a buried in the through holes 30 and 31, and the pin product 9 disposed in the glass frit 6a are fixed to each other. In firing, because the base substrate 2 is fired as the base part 8 is contacted with the pin product 9, the core 7 and the through holes 30 and 31 can be fixed in one piece to each other, while the axial direction of the core 7 remains to be almost matched with the axial directions of the through holes 30 and 31. The glass frit 6a is fired and solidified to be the conical piece 6.

Figure 9:
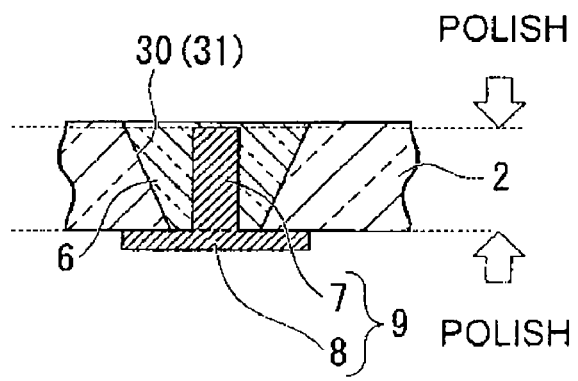
FIG. 9 is a diagram depicting one process of forming the through electrode of the same piezoelectric vibrator.
Figure 10:
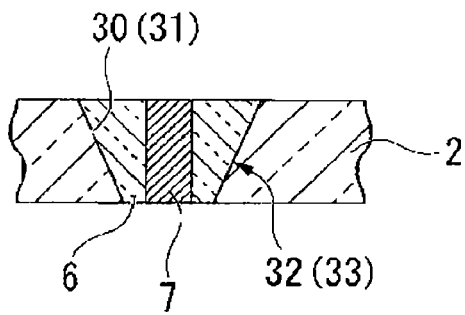
FIG. 10 is a diagram depicting one process of forming the through electrode of the same piezoelectric vibrator.

After fired, as shown in FIG. 9, the base part 8 of the pin product 9 is polished and removed. Thus, the base part 8 that serves to position the conical piece 6 to the core 7 is removed, and only the core 7 is fixed and disposed inside the conical piece 6. Then, at the same time, the top surface of the base substrate 2 is polished into a flat surface until the tip end of the core 7 is exposed. Consequently, as shown in FIG. 10, a pair of the through electrodes 32 and 33 having the conical piece 6 fixed in one piece to the core 7 is formed on the base substrate 2.

At this time, such a scheme may be possible that the base substrate is formed slightly thicker than the thickness when completed, and after polished, the base substrate is formed to have a desired thickness, and the surface of the base substrate 2 is nearly flush with the surfaces of the through electrodes 32 and 33. Furthermore, such a scheme may be possible that a plurality of pairs of the through holes 30 and 31 is formed on a base substrate wafer, through electrodes are formed according to the process steps described above, and then the base substrate wafer is divided and cut to form multiple base substrates 2 having the through electrodes at one time.

The descriptions above are the fabricating method of the through electrode in the embodiment. In the method described above, because all of the base substrate 2, the glass frit 6a, and the pin product 9 are thermally expanded in firing the filler, it is necessary to take account of these expansions and the occurrence of associated stress.

The base substrate 2, the glass frit 6a, and the pin product 9 (particularly the core 7) are expanded according to their thermal expansion coefficients when fired. Generally, it is considered to be preferable that the thermal expansion coefficients of the base substrate 2 and the glass frit 6a are substantially equal. This is because the difference between the thermal expansions causes rare occurrence of stress in the interface between the base substrate 2 and the glass frit 6a.

On the other hand, it is considered to be preferable that the thermal expansion coefficient of the pin product 9 is smaller than the thermal expansion coefficient of the glass frit 6a. This is because such a relation of force occurs in which the glass frit 6a presses the core 7 when fired (see arrows shown in FIG. 8), and the deterioration of hermeticity of the cavity C hardly occurs, which is caused by producing a space between the glass frit 6a and the core 7 when cooled.

However, when the difference between the thermal expansion coefficients of the glass frit 6a and the core 7 is too large, a large tensile stress occurs particularly in the portion around the core 7 in the glass frit 6a, and consequently, the bending strength is sometimes deteriorated. Therefore, it is considered to be preferable that the value of the thermal expansion coefficient of the core 7 is a value smaller than the value of the thermal expansion coefficient of the glass frit for use with a small difference.

Then, in order to investigate the relation between the configurations of the base substrate 2, the glass frit 6a, and the core 7 and the stress occurring in the piezoelectric vibrator 1, simulations were studied. Two types of simulations were performed: the simulation that considers cooling components after fired, and the simulation that considers the state in which a bending stress is applied to a substrate mounted with a fabricated piezoelectric vibrator. The details will be described below.

(1) Cooling Simulation After Fired

As a temperature setting corresponding to firing and cooling components after fired in forming the through electrodes 32 and 33, such a setting was made in which components were cooled from a temperature of 365° C. to a temperature of 25° C. The thermal expansion coefficient of the base substrate 2 was 8.33 ppm of a typical soda-lime glass, and the values of the thermal expansion coefficients of the core and the glass frit were variously set to analyze the stress occurring on the base substrate side and on the glass frit side because of the temperature variation.

(2) Bend Simulation for a Substrate

Figure 11:
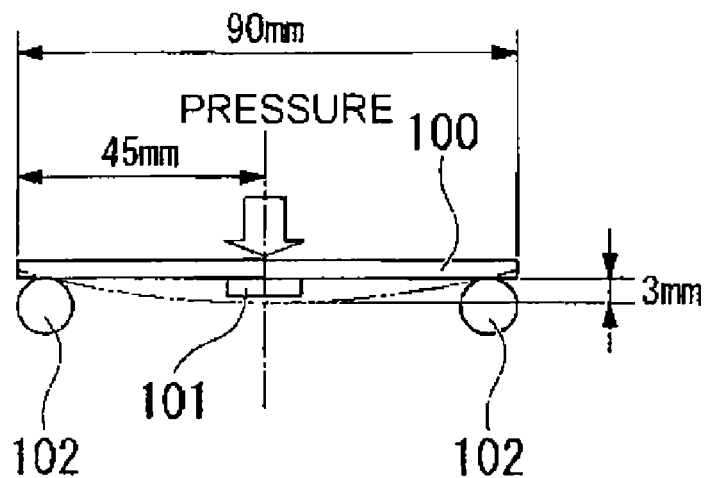
FIG. 11 is a schematic diagram depicting a bending test method of the resistance of a substrate of a standard surface mount component.

FIG. 11 is a schematic diagram depicting a bending test method of the resistance of a substrate of a standard surface mount component (JIS C5206.1.4 (1)). In this method, as shown in FIG. 11, a surface mount component 101 was mounted at the center of the longitudinal direction of a substrate 100 having the size in the longitudinal direction being 90 millimeters (mm), and both ends of the substrate 100 in the longitudinal direction were supported by supports 102 in a predetermined size so as to position the surface mount component 101 below. Then, a predetermined indenter was used to apply a pressure to the center of the substrate 100 in the longitudinal direction from above to bend the substrate 100 such that the center of the substrate 100 in the longitudinal direction was moved 3 mm below.

Figure 12:
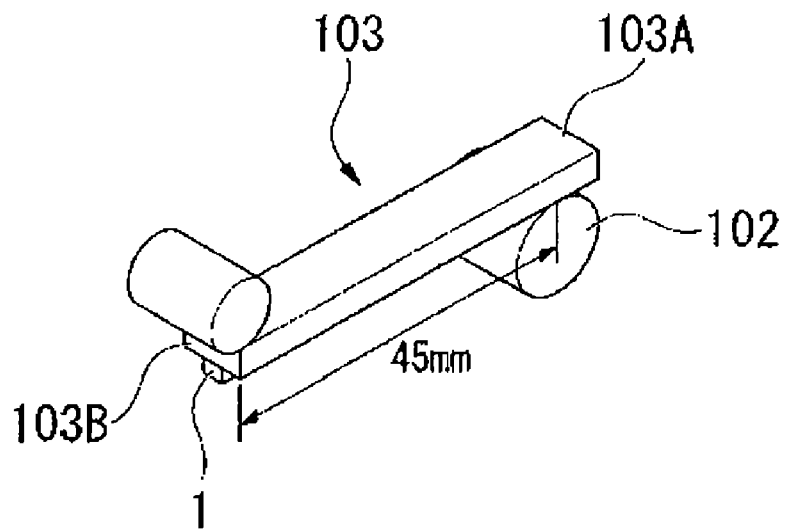
FIG. 12 is a schematic diagram depicting a simulation model for a bending test of the resistance of a substrate according to the embodiment.

FIG. 12 is a diagram depicting a model that was used in this simulation as a half size model for the test method described above. In this model, a first end part 103A of a substrate 103 in the size in the longitudinal direction being 45 mm was supported by a support 102, and the piezoelectric vibrator 1 as a surface mount component was mounted on the undersurface of a second end part 103B. Then, a predetermined indenter was used to apply a pressure from the top surface of the second end part 103B, and the substrate 103 was bent until the second end part 103B was moved 3 mm below. At this point in time, stresses occurring in the base substrate 2, the glass frit 6a, and the lid substrate 3 were analyzed.

In all of the simulations, for the core 7, three types of cores 7 were used in total: one formed of an alloy (Kovar) of iron, nickel, and cobalt, and two types of ones formed of alloys containing only iron and nickel as metals (42 alloy: 58 percent by weight (wt %) of iron and 42 wt % of nickel; and 50 alloy: 50 wt % of iron and 50 wt % of nickel). The thermal expansion coefficients were 4.81 ppm for Kovar, 6.7 ppm for 42 alloy, and 9.7 ppm for 50 alloy. Because the thermal expansion coefficient of the glass frit 6a can be set finely by changing the compositions, the thermal expansion coefficient was set to various values for analysis. The results of these two types of simulations are shown in FIG. 13.

As shown in FIG. 13, under the conditions of using the Kovar core, in all of the cooling simulations after fired and the bending simulations for a substrate, a large stress of 100 megapascals (MPa) or greater occurred in at least one of the base substrate and the glass frit. It was estimated that this was caused by an overlarge difference between the thermal expansion coefficient of Kovar formed of iron, nickel, and cobalt and the thermal expansion coefficient of frit glass.

In contrast to this, under the conditions of using the 42 alloy core and the 50 alloy core containing only iron and cobalt as metals, although the stress occurring was substantially 100 MPa or below, such a tendency was observed that the thermal expansion coefficient of the glass frit was larger than that of the base substrate and the stress occurring became higher as the difference between these coefficients grew. Under the conditions in which the thermal expansion coefficient of the glass frit was the greatest value, 9.7, a stress of 100 MPa or greater occurred on the glass frit in the bending simulation for a substrate. Therefore, it was considered to be preferable that the thermal expansion coefficient of the glass frit was set equal to the thermal expansion coefficient of the base substrate or below.

In addition, apart from the simulations, when the 42 alloy is compared with the 50 alloy, the thermal expansion coefficient of the 42 alloy can be easily set lower than that of the glass frit, and it is considered to be preferable in viewpoint of maintaining the hermeticity of the cavity C.

Therefore, when this as well as the simulation results were considered, it was thought to be the most preferable that the thermal expansion coefficient of the glass frit 6a was set equal to the thermal expansion coefficient of the base substrate 2 or below and an alloy only containing iron and cobalt as metals, 42 alloy, for example, was used to form the pin product 9 for making the thermal expansion coefficient of the core 7 smaller than that of the glass frit 6a. In this case, the order of the thermal expansion coefficients is as below:

base substrate $2 \geq$ glass frit $6a >$ core 7.

In consideration of the results, in the piezoelectric vibrator 1 according to the embodiment, the 42 alloy core is used for the core 7, and the order of the thermal expansion coefficients is set as below:

base substrate $2 \geq$ glass frit $6a >$ core 7.

According to the piezoelectric vibrator 1 thus configured, the hermeticity of the cavity C can be preferably maintained, and damages caused by the occurrence of a large stress when a component is surface mounted can be preferably prevented.

As discussed above, the embodiment of the invention has been described. The technical scope of the invention is not limited to the embodiment above, which can be variously modified within the scope of the teachings of the invention.

For example, in the embodiment, although an example is described that the pin product 9 including the core 7 is formed of 42 alloy, other alloys containing only iron and cobalt as metals may be used to form the core 7, as long as the relation, the base substrate $2 \geq$ the glass frit $6a >$ the core 7, is held in the thermal expansion coefficients. However, because 42 alloy is an alloy that is widely used and available at low costs, the piezoelectric vibrator according to the invention can be readily fabricated at low costs when 42 alloy is used to form the core 7.

The invention claimed is:

1. A piezoelectric vibrator comprising:
a piezoelectric vibrating piece responsive to application of voltage to vibrate;

a shell made of a first material which forms at least a part of a container hermetically enclosing the piezoelectric vibrating pieces; and a through electrode arranged in a through hole formed in the shell and electrically connecting the piezoelectric vibrating piece with an external electrode mounted on an undersurface of the shell, the through electrode comprising:

a filler made of a second material which fills the through hole formed in the shell; and a conductive core made of a third material going through the filler in the through hole for applying the voltage to the piezoelectric vibrating piece, wherein a thermal expansion coefficient of the first material is equal to or larger than a thermal expansion coefficient of the second material, which is larger than a thermal expansion coefficient of the third material;

wherein the conductive core is formed to have substantially the same thickness as a thickness of the through hole formed in the shell;

wherein the filler secures the conductive core in the through hole.

2. The piezoelectric vibrator according to claim 1, wherein the shell is a base of the container and bonded with a lid to form the container.

3. The piezoelectric vibrator according to claim 1, wherein the first material is a glass material.

4. The piezoelectric vibrator according to claim 1, wherein the through hole is of a shape whose inner periphery becomes narrower as the through hole extends from an outer surface of the shell towards an inner surface thereof.

5. The piezoelectric vibrator according to claim 4, wherein the inner periphery is of a conical shape.

6. The piezoelectric vibrator according to claim 1, wherein the second material is a glass frit.

7. The piezoelectric vibrator according to claim 1, wherein the third material comprises iron, nickel and cobalt.

8. The piezoelectric vibrator according to claim 1, wherein the third material comprise iron and nickel.

9. A piezoelectric vibrator comprising:

a piezoelectric vibrating piece responsive to application of voltage to vibrate;

a shell made of a first material which forms at least a part of a container hermetically enclosing the piezoelectric vibrating pieces;

a filler made of a second material which fills a through hole formed in the shell; and a conductive lead made of a third material going through the filling in the through hole for applying the voltage to the piezoelectric vibrating piece, wherein a thermal expansion coefficient of the first material is equal to or larger than a thermal expansion coefficient of the second material, which is larger than a thermal expansion coefficient of the third material;

wherein the third material comprises iron at 50 wt % and nickel at 50 wt %.

* * * * *